(12) United States Patent
Meszaros et al.

(10) Patent No.: US 12,391,264 B2
(45) Date of Patent: Aug. 19, 2025

(54) METHOD AND SYSTEM FOR TESTING A CONTROL UNIT OF A VEHICLE

(71) Applicant: Robert Bosch GmbH, Stuttgart (DE)

(72) Inventors: Albert Meszaros, Budapest (HU); Csaba Juhasz, Budapest (HU); Andras Nemes, Budapest (HU); Peter Meszaros, Debrecen (HU); Peter Mihaly Vas, Budapest (HU); Viktor Imre, Budapest (HU)

(73) Assignee: ROBERT BOSCH GMBH, Stuttgart (DE)

( * ) Notice: Subject to any disclaimer, the term of this patent is extended or adjusted under 35 U.S.C. 154(b) by 171 days.

(21) Appl. No.: 18/251,660

(22) PCT Filed: Nov. 18, 2021

(86) PCT No.: PCT/EP2021/082140
§ 371 (c)(1),
(2) Date: May 3, 2023

(87) PCT Pub. No.: WO2022/122339
PCT Pub. Date: Jun. 16, 2022

(65) Prior Publication Data
US 2024/0001941 A1    Jan. 4, 2024

(30) Foreign Application Priority Data
Dec. 10, 2020    (DE) .............. 10 2020 215 657.3

(51) Int. Cl.
*B60W 50/02*    (2012.01)
(52) U.S. Cl.
CPC . *B60W 50/0205* (2013.01); *B60W 2050/0215* (2013.01)
(58) Field of Classification Search
CPC ................................................. B60W 50/0205
See application file for complete search history.

(56) References Cited

U.S. PATENT DOCUMENTS 10,635,844 B1 *  4/2020  Roose ................. G06F 30/20
11,377,115 B2 *  7/2022  Pretsch ............... G06F 30/20
(Continued)

FOREIGN PATENT DOCUMENTS

DE         10314129 A1   10/2004
DE      102013212710 A1   11/2014
(Continued)

OTHER PUBLICATIONS

International Search Report for PCT/EP2021/082140, Issued Mar. 2, 2022.

(Continued)

*Primary Examiner* — Ramsey Refai
(74) *Attorney, Agent, or Firm* — NORTON ROSE FULBRIGHT US LLP

(57) ABSTRACT

Methods for testing a control unit of a vehicle. The control unit obtains calculated surrounding-area data of a simulated surround sensor, and obtains calculated motion data of a simulated vehicle. The calculated motion data are transmitted to the control unit via a simulated vehicle data bus. Using a sensor testing unit, the calculated surrounding-area data are transmitted to the control unit via a sensor-data transmission circuit different from the vehicle data bus. To execute a simulated acquisition of surrounding-area data, using the control unit, a command for executing a measurement is transmitted to the sensor testing unit, data for identifying the position of the simulated surround sensor is transmitted to the computer device, positions of points of reflection by simulated objects in the surrounding area of the vehicle are calculated and transmitted to the sensor testing unit, and calculated surrounding-area data are determined and transmitted to the control unit.

9 Claims, 8 Drawing Sheets

(56) References Cited

U.S. PATENT DOCUMENTS

| | | | |
|---|---|---|---|
| 11,436,484 B2* | 9/2022 | Farabet | ............... G06V 10/454 |
| 12,182,694 B2* | 12/2024 | Farabet | ................. G06V 10/82 |
| 2018/0060725 A1 | 3/2018 | Groh et al. | |
| 2019/0179979 A1* | 6/2019 | Melick | .................... G06F 30/15 |
| 2019/0303759 A1 | 10/2019 | Farabet et al. | |
| 2020/0184027 A1 | 6/2020 | Dolan | |

FOREIGN PATENT DOCUMENTS

| | | |
|---|---|---|
| DE | 202015104345 U1 | 10/2015 |
| DE | 102016119538 A1 | 4/2018 |
| DE | 102019112200 A1 | 11/2020 |
| DE | 102019120519 A1 | 2/2021 |
| JP | 2018060512 A | 4/2018 |
| JP | 2018124992 A | 8/2018 |

OTHER PUBLICATIONS

Killian Von Neumann-Cosel, "Virtual Test Drive Simulation Umfeldbasierter Fahrzeugfunktionen," Dissertation, 2017, pp. 1-167.

* cited by examiner

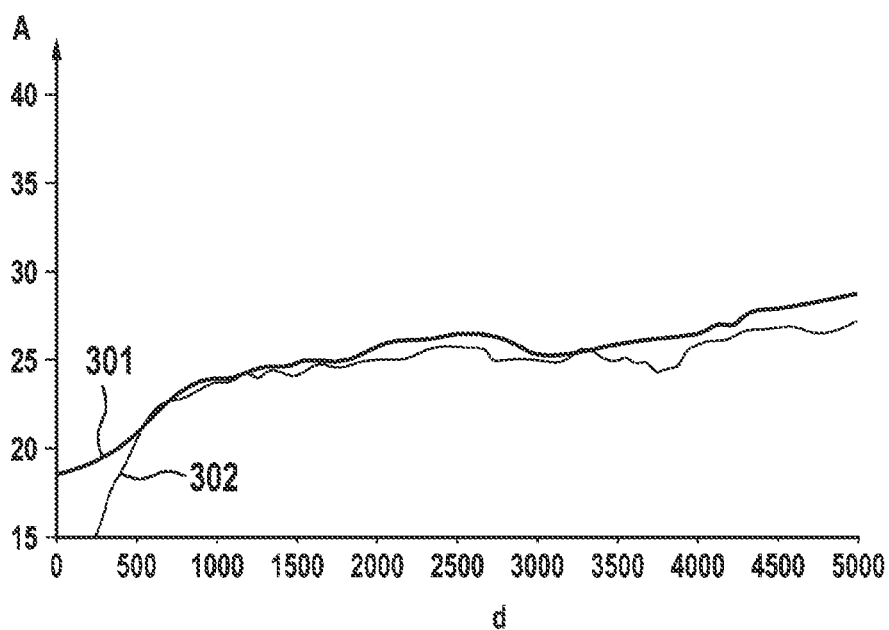
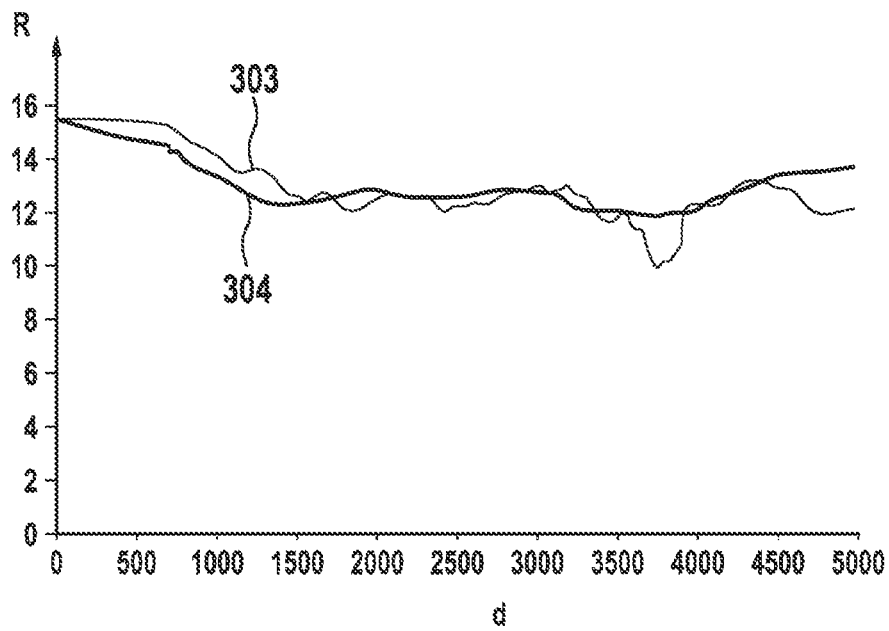

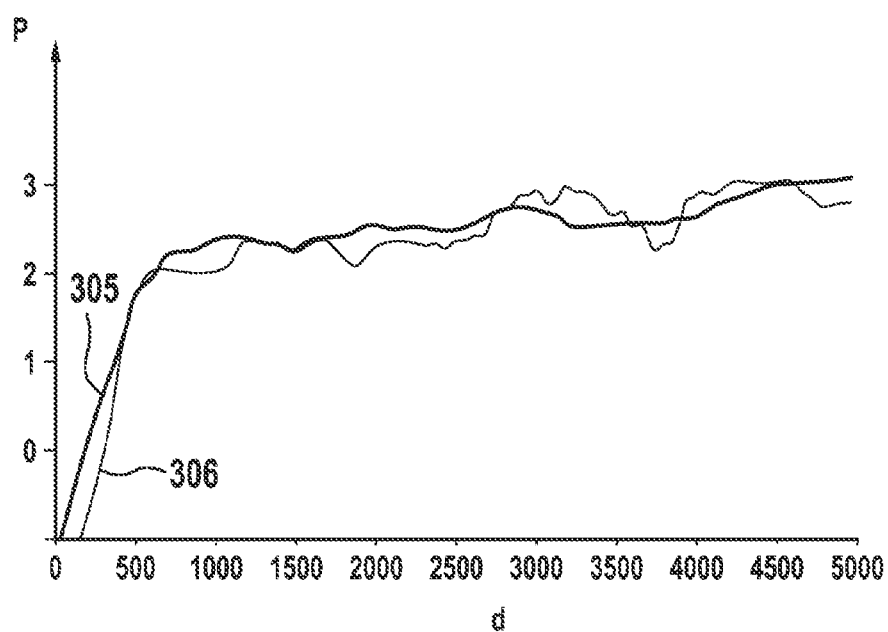
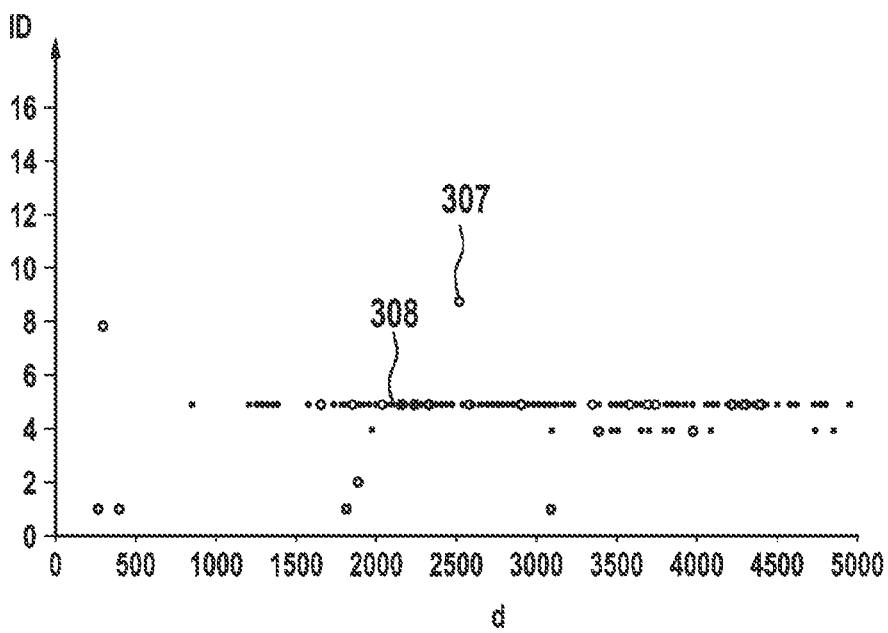

METHOD AND SYSTEM FOR TESTING A CONTROL UNIT OF A VEHICLE

FIELD

The present invention relates to a method for testing a control unit of a vehicle; the control unit obtaining calculated surrounding-area data of at least one simulated surround sensor, using a surround-sensor simulation, and obtaining calculated motion data of a simulated vehicle, using a simulation of a vehicle and a surrounding area; the simulation of the vehicle and surrounding area being implemented by a computer program, which is executed on a programmable computer device; the calculated motion data being transmitted to the control unit via a simulated vehicle data bus; and using a sensor testing unit, which is connected to the programmable computer device; the calculated surrounding-area data being transmitted to the control unit via a sensor-data transmission circuit different from the vehicle data bus. A further aspect of the present invention relates to a system for testing a control unit of a vehicle, which is configured to execute the method.

BACKGROUND INFORMATION

Modern vehicles include several assistance systems, such as parking assistants and emergency braking assistants, in order to assist the driver in the execution of driving maneuvers. For their functionality, the assistance systems are dependent on surrounding-area data, which are obtained by surround sensors situated on the vehicle, such as ultrasonic sensors, radar sensors, lidar sensors, and optical cameras. In this context, the development of the control units for implementing the assistance systems is a complex operation and requires, as a rule, adjustment of the control units for new vehicles.

It is normal to use simulations in the development of new vehicles and systems installed in the vehicles. This allows, for example, the functionality of surround sensors to be tested prior to their installation in a new vehicle. The reaction of control units to the surrounding-area data supplied by the surround sensors may be tested in the same manner.

German Patent Application No. DE 10 2013 212 710 A1 describes a simulator and a method for simulating sensor measurements. The simulator includes a sensor model, which describes hardware and/or physical characteristics of the sensor. In addition, a model of the surroundings and a vehicle model are provided, which are used for performing a virtual measurement. In the case of implementation in the form of hardware, a processing unit used may take the form of a control computer of a vehicle.

German Patent No. DE 103 14 129 A1 describes a method and a computer program for simulating a detection range of a sensor. The detection range of a sensor, in particular, of an ultrasonic sensor, is ascertained by simulating amplitude values and reception times of echoes, which a receiver of the sensor at a fixed installation position would receive as reflections of radiation by a standard body, if the standard body were situated at different positions in the emission range of a radiation source of the sensor having a known directional characteristic, and if the standard body were irradiated there by the radiation source. In this context, the simulation is carried out in view of the speed of propagation of the radiation, as well as the distances and the angular relationships between the specific positions of the standard body, of the receiver, and of the radiation source relative to each other. Subsequently, the positions, for which the respective amplitude values of the echoes of the standard body are above a defined threshold value, are determined; the distribution of these positions in space representing the detection range of the sensor.

U.S. Patent Application Publication No. US 2018/0060725 A1 describes a method and a test stand for simulating sensor reflections, such as of virtual ultrasonic sensors. The test stand includes hardware, which implements and makes available mathematical models of the mechanical characteristics of a vehicle, as well as software, which is coupled to the hardware and includes a test algorithm for processing reflections, which are obtained from a virtual area surrounding a vehicle.

During the testing of the reaction of a control unit to obtained surrounding-area data of simulated surround sensors, the surrounding area of the simulated vehicle, including all of the objects in the surrounding area, must be simulated, first of all. If, in so doing, the functions of complex systems of a control unit, such as a parking assistant or an emergency braking assistant, are intended to be checked, then, in this context, in particular, the movement of the simulated vehicle relative to the simulated objects must also be considered.

The conventional methods for simulating functions of a surround sensor have the problem, that a temporal offset between the simulation of the surrounding area and the movement of the vehicle and the calculation of the simulated surrounding-area data may occur, which means that the reaction of a control unit tested by the simulation may be impaired. For example, without synchronization of motion data and surrounding-area data, a control unit is unable to generate a reliable map of objects in the surrounding area of the vehicle.

SUMMARY

According to an example embodiment of the present invention, a method for testing a control unit of a vehicle is provided, in which the control unit obtains calculated surrounding-area data of at least one simulated surround sensor, using a surround-sensor simulation, and obtains calculated motion data of a simulated vehicle, using a simulation of a vehicle and surrounding area; the simulation of the vehicle and surrounding area being implemented by a computer program, which is executed on a programmable computer device; the calculated motion data being transmitted to the control unit via a simulated vehicle data bus; and using a sensor testing unit, which is connected to the programmable computer device, the calculated surrounding-area data being transmitted to the control unit via a sensor-data transmission circuit different from the vehicle data bus.

In addition, according to an example embodiment of the present invention, to carry out simulated acquisition of surrounding-area data, using the control unit, in a first step a), a command to execute a measurement, using at least one surround sensor simulated by the surround-sensor simulation, is transmitted by the control unit to the sensor testing unit.

In a subsequent step b), information for identifying the position of the at least one simulated surround sensor is transmitted by the sensor testing unit to the computer device.

Subsequently, in a step c), the position of points of reflection by simulated objects in the surrounding area of the vehicle are calculated by the computer device, and data regarding the calculated positions of the reflection points are transmitted to the sensor testing unit.

In a subsequent step d), calculated surrounding-area data are determined by the sensor testing unit on the basis of the data about the calculated positions of the reflection points.

Subsequently, in a step e), the sensor testing unit transmits the calculated surrounding-area data regarding the obtained positions of the reflection points, to the control unit.

The control unit may be, for example, a control unit for implementing a function of the vehicle; the function making decisions based on the receipt of surrounding-area data. The function may be, in particular, an assistance system or an automated driving function of a vehicle. For example, the control unit may implement a parking assistant or an emergency braking assistant.

According to an example embodiment of the present invention, to prepare the test of the functionality of the control unit and/or of a function implemented in the control unit, the computer device and the sensor testing unit receive data regarding the simulated vehicle and the at least one simulated surround sensor. In this context, these data preferably include data about the physical characteristics of the at least one surround sensor, data regarding the positioning of the at least one surround sensor on the vehicle, data regarding handling characteristics of the vehicle, and combinations of several of these data. In this instance, in particular, a plurality of simulated surround sensors may be defined.

In addition, according to an example embodiment of the present invention, in order to set up the simulation of the vehicle and surrounding area, a simulated surrounding area is preferably defined for the simulated vehicle. In this context, in particular, simulated objects are defined. In this instance, the simulated objects may be defined, in particular, by parameters regarding their shape, the type of object, the size, the orientation, the position in the simulated surrounding area, and combinations of pluralities of these parameters. For example, for a test of an assistance system, a plurality of poles may be defined by defining the parameters of cylindrical shape, predefined height, predefined diameter, and predefined positions.

According to an example embodiment of the present invention, if the simulated vehicle includes more than one simulated surround sensor, then, in step a), it is preferable that, together with the command for executing a measurement, data be transmitted, which allow the sensor testing unit to identify the corresponding surround sensor, from which a simulated measurement is requested. If each individual surround sensor is able to communicate with the control unit via a separate cable connection, then such information may also be omitted.

The at least one simulated surround sensor may correspond to a surround sensor actually present or may be based on a design of a surround sensor in development. The at least one simulated surround sensor is preferably a surround sensor, which is based on the pulse-echo principle. Accordingly, a signal is emitted for a measurement by a surround sensor, and echoes of the signal, which have been reflected by objects in the surrounding area, are subsequently received. In this context, if the echo is received by the same surround sensor that emitted the original signal, then the echo is referred to as a direct echo. If the echo is received by a different surround sensor, the echo is referred to as a cross echo. Accordingly, a command for carrying out a measurement may relate to a single simulated surround sensor or two or more of the simulated surround sensors. Accordingly, it is preferable when, in step a), the measurement of a cross echo is requested, and, in step b), data regarding the position of a transmitting surround sensor and data regarding the position of a receiving surround sensor are transmitted.

According to an example embodiment of the present invention, in step b) of the method, the sensor testing unit transmits data for identifying the position of the simulated surround sensor(s) involved in a measurement to the computer device. For example, a plurality of surround sensors may be involved in the execution of a measurement, in which a cross echo is intended to be received. The data for identifying the position of the at least one surround sensor may be transferred in the form of coordinates, which describe the position of the specific surround sensor in the simulation of the vehicle and surrounding area. If the computer device has, for example, data regarding the position at which a simulated surround sensor is situated on the simulated vehicle, however, such information may also be transmitted, for example, in the form of a unique identification number. It is also possible to transmit a relative position with regard to a reference point of the simulated vehicle, as information for identifying the position.

According to an example embodiment of the present invention, in step c) of the method, based on the simulation of the vehicle and surrounding area, the computer device performs a calculation as to which of the simulated objects reflects back an echo of a signal of the at least one simulated surround sensor, and determines the position of points of reflection by the simulated objects.

According to an example embodiment of the present invention, during the determination of the position of the points of reflection, the simulation of the vehicle and surrounding area takes into account, in particular, the relative positions of the simulated objects with respect to the simulated vehicle, which continually change in response to the independent motion of the simulated vehicle and/or of one of the simulated objects. In other words, by carrying out the simulation of the vehicle and surrounding area, the computer device determines the geometry of a model, which represents the simulated vehicle in a simulated surrounding area. In this context, to determine the position of the points of reflection, for example, a beam, which emanates from the position of the simulated surround sensor and runs in the direction of a major axis of the simulated surround sensor, may be checked for points of intersection with surfaces of the simulated objects. The positions of the points of intersection then represent positions of points of reflection. In addition, reflection points may be calculated in view of predefined rules. For example, when ultrasonic sensors are used as surround sensors, an object generates several echoes; an echo being formed at a base of the object.

According to an example embodiment of the present invention, the simulation of the vehicle and surrounding area is preferably executed continually by the computer device. In this context, regularly computed motion data of the simulated vehicle is transmitted to the control unit; the determination of the position of reflection points according to step c) being synchronized temporally with the simulation of the vehicle and surrounding area.

The calculated motion data include, in particular, simulated data from simulated vehicle sensors, which ascertain the motion of the simulated vehicle. These include, in particular, odometric sensors, engine speed sensors, yaw rate sensors, acceleration sensors, and combinations of a plurality of these sensors.

According to an example embodiment of the present invention, for temporal synchronization of the calculated motion data and the calculated surrounding-area data, the calculation of the motion data and the calculation of the reflection points, on the basis of which the surrounding-area data are determined, are carried out via the same simulation of the vehicle and surrounding area. In addition, time delays during the transmission of the motion data and the surrounding-area data, which arrive at the control unit over different paths, are designed to be as short as possible.

In step d), the calculated surrounding-area data are preferably determined in view of a visual range (also referred to as a field of view) of the respective, simulated surround sensor and/or in view of the intended installation location on the vehicle.

The visual range of a surround sensor is determined, on one hand, by the specific form and the technology of the sensor. On the other hand, the installation location of the specific surround sensor affects its visual range considerably. For example, surround sensors based on ultrasonics are often integrated into a bumper of the vehicle; the shaping, the choice of material, and the attachment of the bumper being able to affect the visual range of the surround sensor. In order to be able to already test the reaction of a control unit early in the design procedure to surrounding-area data of a sensor positioned in such a manner, the visual range resulting from the planned positioning of the surround sensor is taken into account in the determination of the calculated surrounding-area data.

According to an example embodiment of the present invention, in order to take into account the installation location and the surroundings at the installation location, it is preferable for a simulation of the propagation behavior of the emitted signals and the received echoes to be carried out; 3-D models preferably being used for this. For example, in the case of installing a surround sensor in a bumper, a 3-D model of this bumper and, possibly, of the surroundings of the bumper on the vehicle, may be used. Consequently, in some instances, effects of further factors, such as signal reflections by a license plate of the vehicle, by a radiator grille of the vehicle, and/or by the ground, may also be taken into account. In addition, the simulation preferably takes into account the specific propagation characteristics of the signals and echoes, which may be a function of, in particular, a frequency of the signals, as well.

According to an example embodiment of the present invention, during the specific computation of the surrounding-area data, which are obtained by the simulated sensor, a simulated echo is calculated initially; in addition to the position of the point of reflection, in particular, the visual range also having an influence on this calculation. If a plurality of reflection points are obtained, it is preferable for interference between the plurality of echoes produced to be considered, as well.

After the simulated echo is calculated, it is preferable for the same signal processing to be carried out, which a corresponding, actual sensor would also run through for the respective echo, in order to obtain the calculated surrounding-area data.

To evaluate the calculated sensor data, in a first embodiment variant i), the calculated surrounding-area data may be calculated in advance and stored in a storage device of the sensor testing unit; a coordinate grid having a predefined step size being used for positional parameters of a simulated vehicle and a simulated object.

Consequently, using a particular, predefined step size for parameters, such as the relative distance between the simulated surround sensor and the simulated object and the direction to the simulated object, the calculated surrounding-area data are already determined in advance and stored in a storage device of the sensor testing unit. If the sensor testing unit then receives a calculated position of a point of reflection, the data set, whose parameters have the lowest deviations from the parameters of the respective reflection point, is determined from the quantity of surrounding-area data calculated in advance.

This variant of the method permits the use of complex models for determining the calculated surrounding-area data. Since the surrounding-area data are calculated in advance, a particularly short delay advantageously occurs during the transmission to the control unit.

In a second embodiment variant ii), the calculated surrounding-area data are processed by a processing unit of the sensor testing unit after the data regarding the calculated positions are received.

Since only general geometric data regarding the position of points of reflection are needed to determine the calculated surrounding-area data from the simulation of the vehicle and surrounding area, the quantity of data exchanged between the computer device and the sensor testing unit is very small, which allows rapid transmission. In addition, these data do not allow the internal functioning of the simulated surround sensor to be deduced, so that cryptographic protection, which could delay transmission of the data, is also not required.

According to an example embodiment of the present invention, in step e), the determined, calculated surrounding-area data are transmitted to the control unit. In this context, a communication protocol is selected, which is used for the communication between the control unit and the sensor testing unit and is preferably identical to the protocol, which an actual version of the at least one surround sensor simulated by the sensor testing unit would use. In addition, it is preferable for the communication to be protected cryptographically.

The at least one simulated surround sensor is preferably an ultrasonic sensor. However, the method according to the present invention may also be applied to other types of sensors, such as lidar sensors or radar sensors.

For the case in which the at least one simulated surround sensor is an ultrasonic sensor, the calculated surrounding-area data preferably include a distance between the simulated surround sensor and the corresponding point of reflection, as well as at least one attribute describing the quality of a received ultrasonic echo.

Examples of attributes describing the quality of a received ultrasonic echo include the amplitude, the background noise, the R-value, and combinations of them.

The "R-value" of an ultrasonic echo describes how well the shape of the received echo corresponds to the shape of the signal emitted originally. For example, an optimum filter may be used for comparing the shape.

The vehicle data bus is preferably a CAN bus or FlexRay. In principle, however, any transmission technology used in the vehicle is suitable.

By connecting the computer device to a bus system, which corresponds to the vehicle data bus of an actual vehicle, the control unit may be tested directly under conditions that are as realistic as possible.

If the tested control unit is configured to transmit control commands over the vehicle data bus, in order to influence the longitudinal and/or lateral guidance of the simulated vehicle, then the simulation of the vehicle and surrounding area is preferably configured in such a manner, that it reacts to the control commands and influences the motion of the simulated vehicle accordingly. In addition, the simulation of the vehicle and the motion preferably delivers appropriate feedback of the addressed vehicle systems to the control unit. This is, in particular, advantageous for the testing of control units, which implement functions that influence the motion of the vehicle, such as a parking assistant or an emergency braking assistant. One further aspect of the present invention is providing a system for testing a control unit of a vehicle; the system including a computer device, which may be connected to the control unit via a vehicle data bus, and a sensor testing unit, which is connected to the computer device and may be connected to the control unit via a sensor terminal.

According to an example embodiment of the present invention, the system is configured to execute one of the methods described here when connected to a control unit for a vehicle.

Accordingly, features described in the scope of one of the methods apply to the system, and conversely, features described within the scope of the system apply to the methods.

According to an example embodiment of the present invention, the system includes a computer device. This is preferably freely programmable and executes the simulation of the vehicle and surrounding area within the scope of the method. The computer device is preferably a customary PC, which is run, for example, by the Windows, Linux, or MacOS operating system and is involved in the method through execution of corresponding software.

The sensor testing unit is a unit, which is separate from the computer device and communicates with the computer device via a data transmission circuit. The sensor testing unit may include a storage device and/or a processing unit for determining the calculated surrounding-area data. For example, a programmable microcontroller and/or an application-specific integrated circuit (ASIC) may be used for implementing the functions of the sensor testing unit.

Using the method according to the present invention and/or the system according to the present invention for testing a control unit, a particularly time-critical part of the executed simulation, namely, the determination of calculated surrounding-area data, is advantageously outsourced to specialized hardware, namely, the sensor testing unit. Consequently, the computer device provided must only perform general tasks and the updating of the simulation of the vehicle and surrounding area. In comparison with customary PC's as computer devices, specialized units, such as the sensor testing unit, exhibit deterministic behavior in the case of time-critical actions, which means that first of all, a time delay between the motion data and the surrounding-area data is reduced, and secondly, any residual delay is uniform. However, in the case of a normal computer device, many different tasks are normally executed by it simultaneously; the execution of individual tasks in a non-deterministic manner being able to be delayed.

The behavior of the control units in response to movement of the simulated vehicle may only be simulated realistically and thus, tested, due to the synchronization between the motion data and the surrounding-area data achieved by the method and system of the present invention.

In addition, the method used for determining the surrounding-area data from the echoes obtained may be protected cryptographically by the method of the present invention, without a delay occurring during the transmission to the control unit. This is accomplished in that the sensor testing unit constitutes a closed system, which does not allow access to databases that are stored in advance and include surrounding-area data calculated in advance, or access to the algorithms used for calculating the surrounding-area data. The sensor testing unit itself receives only general geometric data regarding the position of points of reflection from the vehicle and surrounding-area simulation carried out on the computer device; the geometric data not allowing any inferences about the functioning of the simulated surround sensor. Consequently, the communication between the computer device and the sensor testing unit is reduced, first of all, to a small amount of data that may be transmitted rapidly. On the other hand, cryptographic protection is not necessary, which means that no time delay caused by encryption occurs.

The calculated surrounding-area data then provided by the sensor testing unit are supplied to the control unit via the same protocol that a real sensor would also use, which means that the control unit may be tested under conditions that are as realistic as possible. This already allows the functionality of the surround sensors and the control units to be tested early in the design phase of a vehicle.

BRIEF DESCRIPTION OF THE DRAWINGS

Specific embodiments of the present invention are explained in more detail with the aid of the figures and the following description.

FIG. 4 shows a comparison between the amplitude of simulated and actual echoes as a function of the distance.

FIG. 5 shows a comparison between the R-value of simulated and real echoes as a function of the distance.

FIG. 6 shows a comparison between a significance classification undertaken by the control unit, for simulated and real echoes, as a function of the distance.

FIG. 7 shows a comparison between an object classification undertaken by the control unit, for simulated and real echoes, as a function of the distance.

DETAILED DESCRIPTION OF EXAMPLE EMBODIMENTS

Figure 1:
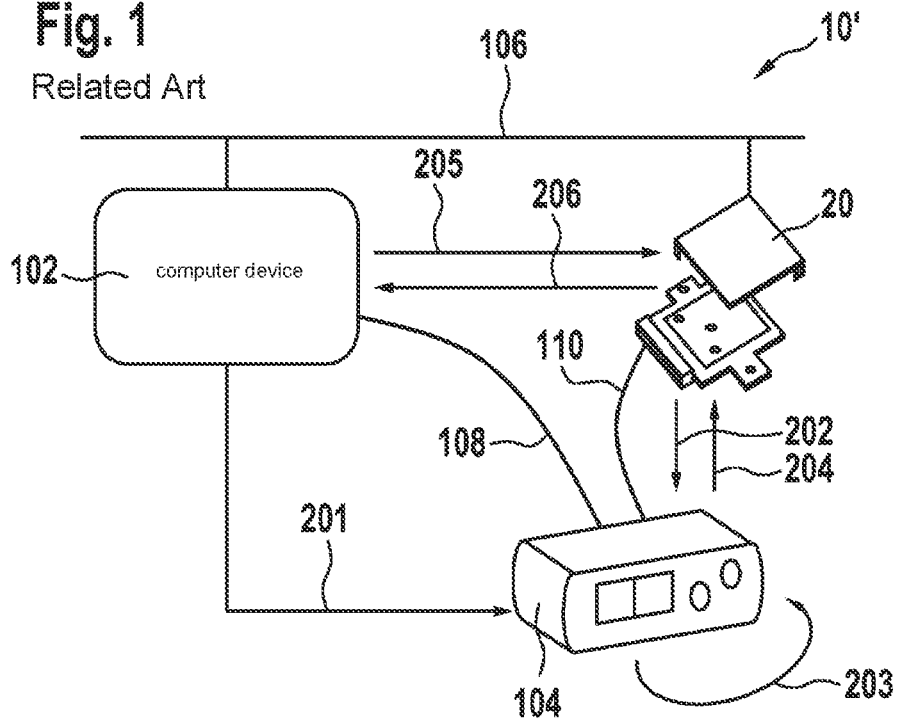
FIG. 1 shows a system for testing a control unit according to the related art.

In the following description of the specific example embodiments of the present invention, identical or similar elements are denoted by the same reference numerals, in which case a repeated description of these elements in single instances is omitted.

The figures only depict the subject matter of the present invention schematically.

A system 10' of the related art for testing a control unit 20 is represented in FIG. 1. System 10' includes a computer device 102 and a sensor testing unit 104, which are connected to each other by a data transmission cable 108 and are able to exchange data.

Sensor testing unit 104 is connected to the control unit 20 to be tested, via a sensor data transmission circuit 110. Control unit 20 and computer device 102 are also connected via a vehicle data bus 106.

In order to simulate the behavior of control unit 20 on surrounding-area data, computer device 102 continually updates a simulation of a vehicle and surrounding area; the simulation being controlled via control commands of control unit 20 for influencing the longitudinal and/or lateral guidance of simulated vehicle 401. In FIG. 1, the transmission of control commands is indicated by an arrow having the reference numeral 206. A schematic view of the situation represented by the simulation of a vehicle and surrounding area may be taken from FIG. 3.

Motion data, which are transmitted via vehicle data bus 106 to control unit 20, as indicated by the arrow having reference numeral 205, are calculated, using the simulation of the vehicle and surrounding area carried out continually. Simultaneously to this, computer device 102 determines possible surround-sensor data, which could be acquired by a simulated surround sensor 402, cf. FIG. 3, and possibly requested by control unit 20. In this context, computer device 102 considers all possible surrounding-area data. This means that, for example, in the case of a plurality of ultrasonic-based surround sensors 402 and in the case of a plurality of simulated objects 404, cf. FIG. 3, all possible direct echoes and cross echoes are determined for each simulated surround sensor 402, and the corresponding, calculated surrounding-area data are determined.

Since these calculated surrounding-area data could allow the algorithms used in simulated surround sensor 402 to be identified, all calculated surrounding-area data are transmitted to sensor testing unit 104 in encrypted form, as indicated by the arrow having the reference numeral 201. Sensor testing unit 104 must now decrypt the calculated surrounding-area data and store them in a storage device. The transmission via data transmission cable 108 requires a considerable period of time due to the large quantity of data, and a further time delay occurs because of the time-consuming encryption and decryption, which means that the calculated surrounding-area data stored in the storage device of sensor testing unit 104 are not synchronous in time with the calculated motion data, which are supplied to control unit 20 over vehicle data bus 106. If control unit 20 now requests a measurement of one of the simulated surround sensors 402, which is indicated by an arrow having the reference numeral 202, then the internal storage device is read out, as indicated by arrow 203, and the calculated surrounding-area data determined in this context are transmitted to control unit 20, as indicated by the arrow having the reference numeral 204.

Since the calculated surrounding-area data obtained by control unit 20 are not synchronous with the calculated motion data supplied, the behavior of the control unit 20 tested in this manner may deviate from the behavior in a real environment.

Figure 2:
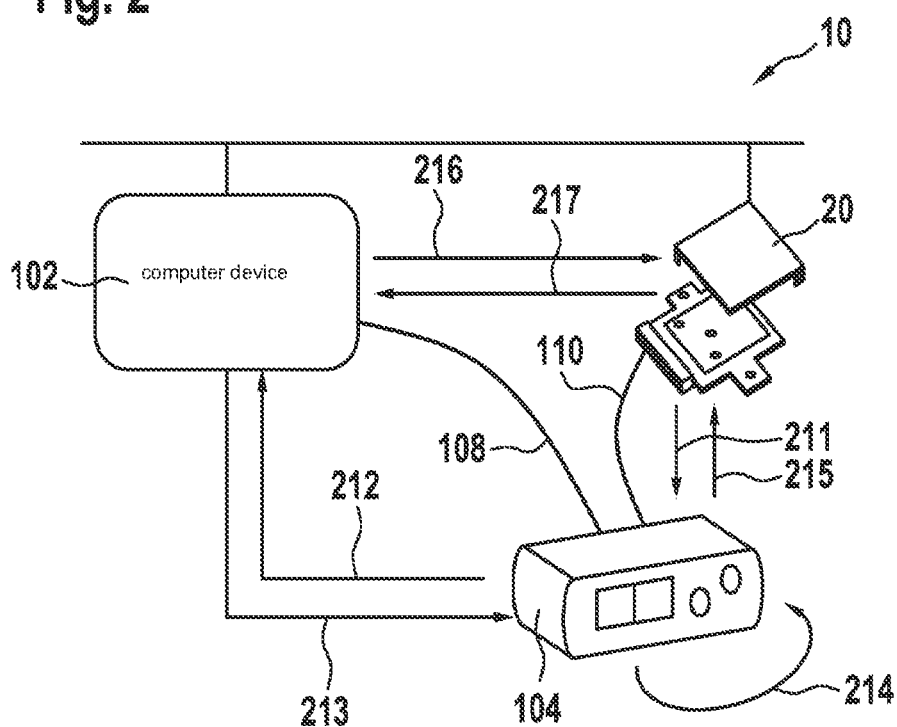
FIG. 2 shows a system of the present invention for testing a control unit, according to an example embodiment of the present invention.

FIG. 2 shows a system 10 of the present invention for testing a control unit 20. System 10 includes a computer device 102 and a sensor testing unit 104, which are connected to each other by a data transmission cable 108 and are able to exchange data.

Sensor testing unit 104 is connected to the control unit 20 to be tested, via a sensor data transmission circuit 110. Control unit 20 and computer device 102 are also connected via a vehicle data bus 106. Consequently, in system 10, control unit 20 has the same connections as in an actual vehicle.

In order to simulate the behavior of control unit 20 on surrounding-area data, computer device 102 continually updates a simulation of a vehicle and surrounding area; the simulation being controlled via control commands of control unit 20 for influencing the longitudinal and/or lateral guidance of simulated vehicle 401. In FIG. 2, the transmission of the control commands is indicated by an arrow having the reference numeral 216. A schematic view of the situation represented by the simulation of a vehicle and surrounding area may be taken from FIG. 3.

Motion data, which are transmitted by vehicle data bus 106 to control unit 20, as indicated by the arrow having reference numeral 217, are calculated by the simulation of the vehicle and surrounding area that is carried out continually.

If control unit 20 now requests a measurement of one of the simulated surround sensors 402, a corresponding command, as indicated by arrow 211, is sent to sensor testing unit 104; the command including information for identifying the simulated surround sensor(s) 402 involved. These data are passed on by sensor testing unit 104 to computer device 102, as indicated by the arrow having the reference numeral 212.

Computer device 102 now determines points of reflection 410, 412 as a function of the position of the simulated surround sensors 402 involved and the current state of the simulation of the vehicle and surrounding area, and transmits data regarding the position of reflection points 410, 412 back to sensor testing unit 104, as indicated by arrow 213. Since these data regarding the position are purely geometric data, they constitute only a small quantity of data and may be transmitted rapidly via data transmission cable 108. In addition, they do not reveal any details regarding the method of functioning of simulated surround sensor 402 and may therefore be transmitted unencypted, which speeds up the transmission further.

Now, the calculated surrounding-area data are determined by sensor testing unit 104, which is indicated in FIG. 2 by the arrow having the reference numeral 214. The determined surrounding-area data are subsequently transmitted to control unit 20, as indicated by the arrow having the reference numeral 215.

The calculated surrounding-area data received by control unit 20 arrive at control unit 20 with a minimal time delay and are therefore temporally synchronous with the calculated motion data received. This allows the behavior of control unit 20 to be tested during the motion of simulated vehicle 401, as well.

Figure 3:
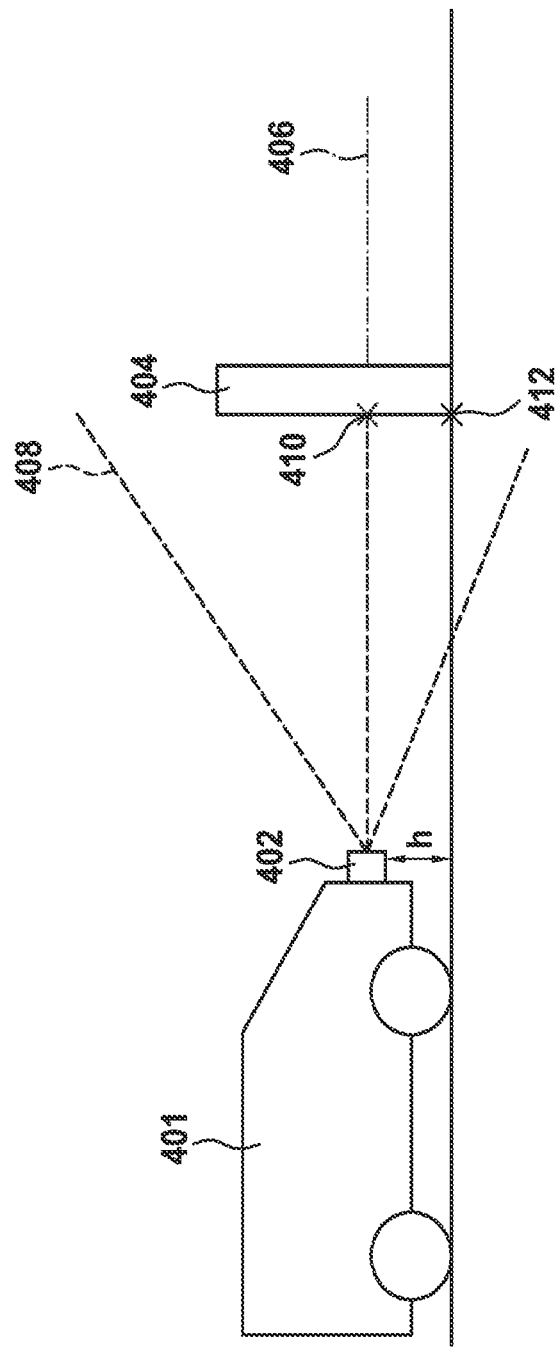
FIG. 3 shows a schematic view of a simulated surrounding area of a simulated vehicle, according to an example embodiment of the present invention.

FIG. 3 shows a schematic view of a simulated surrounding area of a simulated vehicle 401. In the situation represented in FIG. 3, simulated vehicle 401 moves towards a simulated object 404 in the form of a circular-cylindrical pole.

Simulated vehicle 401 includes a simulated surround sensor 402, which takes the form of an ultrasonic sensor, for example. Simulated surround sensor 402 has a visual range 408, within which it is able to detect simulated objects 404. Simulated surround sensor 402 is installed in front in the region of a bumper (not shown), at an installation height h. Simulated surround sensor 402 is oriented horizontally towards the front, so that a major axis 406 of simulated surround sensor 402 is oriented parallelly to the ground, as well.

If signals are emitted by simulated surround sensor 402, it is able to detect echoes, which are reflected at reflection points 410, 412 on simulated object 404. In the situation represented in FIG. 3, simulated surround sensor 402 would receive two echoes, one from a first reflection point 410 at an elevation of installation height h, and one from a second reflection point 412 at a base of simulated object 404. Since the path from simulated surround sensor 402 to second reflection point 412 is longer than the one to first reflection point 410, then, in the situation shown, simulated surround sensor 402 receives two consecutive echoes.

FIG. 4 shows a comparison of the amplitude of simulated and real echoes as a function of the distance, for a situation as represented schematically in FIG. 3. In this context, a simulated vehicle 401 having a simulated ultrasonic sensor moves towards an obstacle in the form of a pole.

In the graph of FIG. 4, amplitude A is plotted in arbitrary units on the y-axis, and distance d of reflection point 410, 412 from simulated surround sensor 402 is plotted in mm on the x-axis. In this case, a first curve 301 shows the averaged characteristic of the obtained amplitude from an actual measurement of the surrounding-area data, and a second curve 302 shows the averaged characteristic of the obtained amplitude on the basis of the calculated surrounding-area data.

It may be deduced from the representation of FIG. 4, that the calculated surrounding-area data conform well to the surrounding-area data actually measured.

FIG. 5 shows a comparison of the R-value of simulated and real echoes as a function of distance d, for a situation as represented schematically in FIG. 3.

In the graph of FIG. 5, the R-value is plotted in arbitrary units on the y-axis, and distance d of reflection point 410, 412 from simulated surround sensor 402 is plotted in mm on the x-axis. In this context, a first curve 303 shows the averaged characteristic of R-values associated with actual measurements of the surrounding-area data, and a second curve 304 shows the averaged characteristic of R-values associated with calculated surrounding-area data.

It may again be deduced from the representation of FIG. 5, that the calculated surrounding-area data conform well to the surrounding-area data actually measured.

FIG. 6 shows a comparison between a significance classification undertaken by control unit 20, for simulated and real echoes, as a function of distance d, for a situation as represented schematically in FIG. 3.

In the graph of FIG. 6, significance P is plotted in arbitrary units on the y-axis, and distance d of reflection point 410, 412 from simulated surround sensor 402 is plotted in mm on the x-axis. In this context, a first curve 305 shows the averaged characteristic of the significance P determined from an actual measurement of the surrounding-area data, and a second curve 306 shows the averaged characteristic of the significance P ascertained on the basis of the calculated surrounding-area data.

Significance P is determined by control unit 20 and constitutes a probability that the surrounding-area data obtained represent an object actually present in the surrounding area.

It may be deduced from the representation of FIG. 6, that the significance P obtained, using the calculated surrounding-area data, conforms well to the significance values obtained for the surrounding-area data actually measured.

FIG. 7 shows a comparison of an object classification undertaken by control unit 20, for simulated and real echoes, as a function of distance d, for a situation as represented schematically in FIG. 3.

In the graph of FIG. 7, an ID number, which denotes the object class, is indicated on the y-axis. In this context, different object types, such as poles, bushes, walls, curbs, and the like, are each provided with different ID numbers.

In this context, first points 307 show the object classification on the basis of an actual measurement of the surrounding-area data, and second points 308 show the object classification on the basis of the calculated surrounding-area data ascertained significance.

It may be deduced from the representation of FIG. 7, that the object classification obtained, using the calculated surrounding-area data, conforms well to the object classifications obtained for the surrounding-area data actually measured.

Figure 8A:
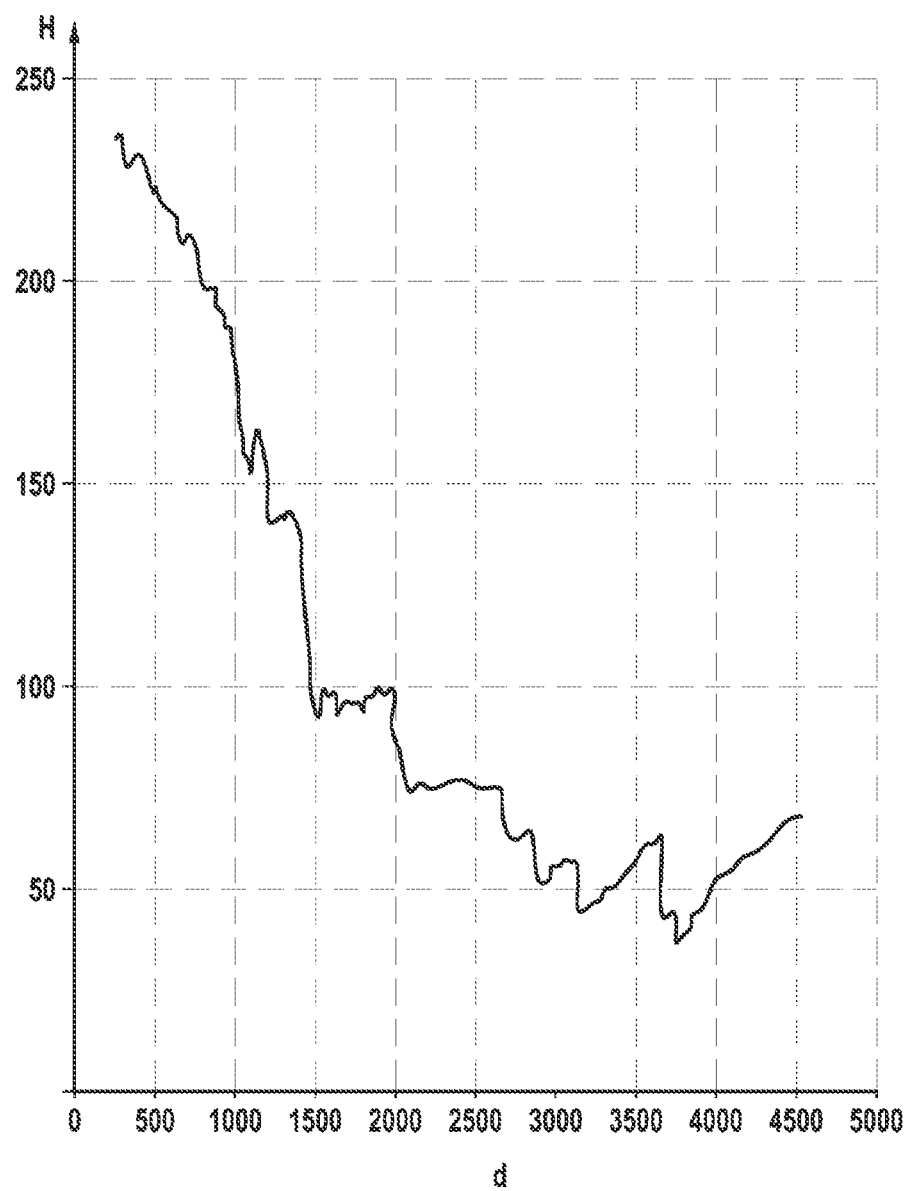
FIGS. 8A and 8B show a comparison between a classification of magnitude undertaken by the control unit, for simulated and real echoes, as a function of the distance, at a speed of 2.5 km/h.
Figure 8B:
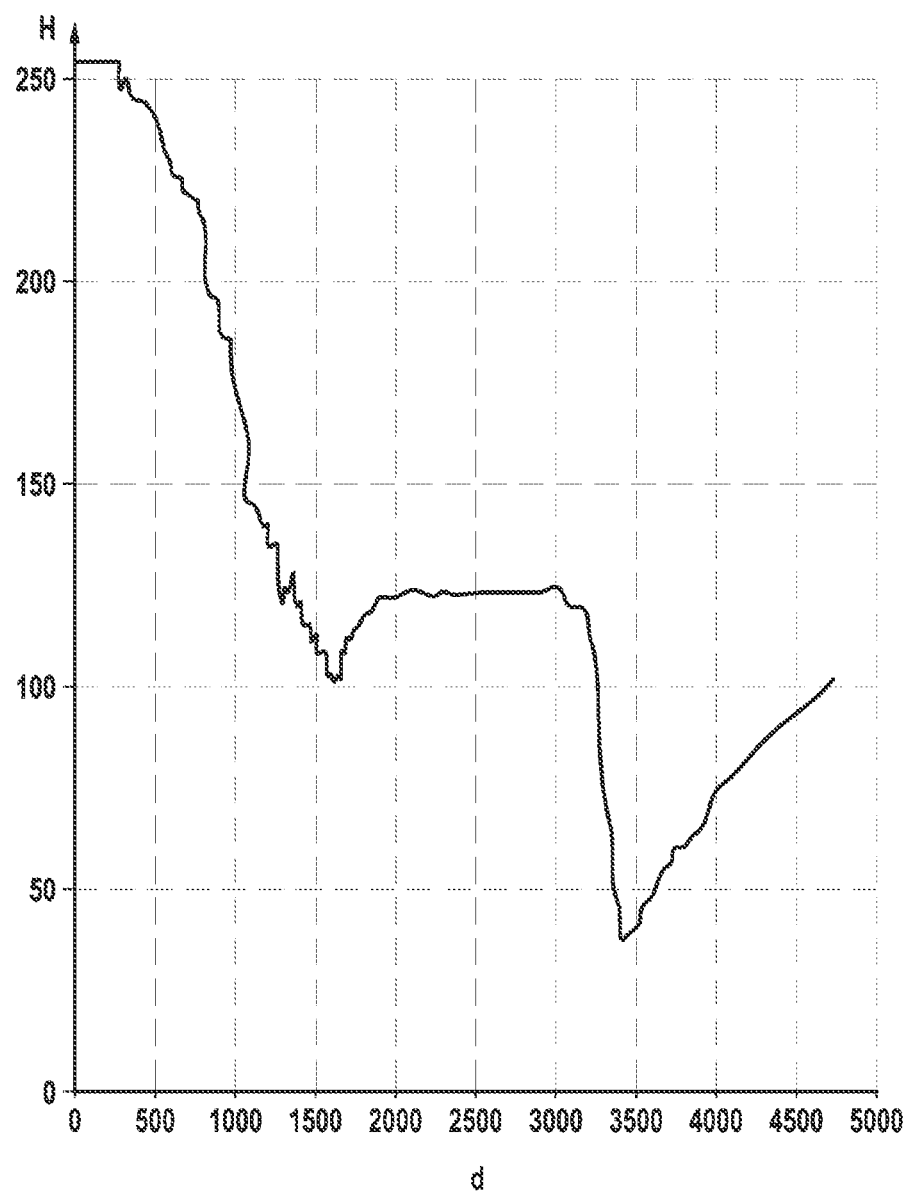
Figure 9A:
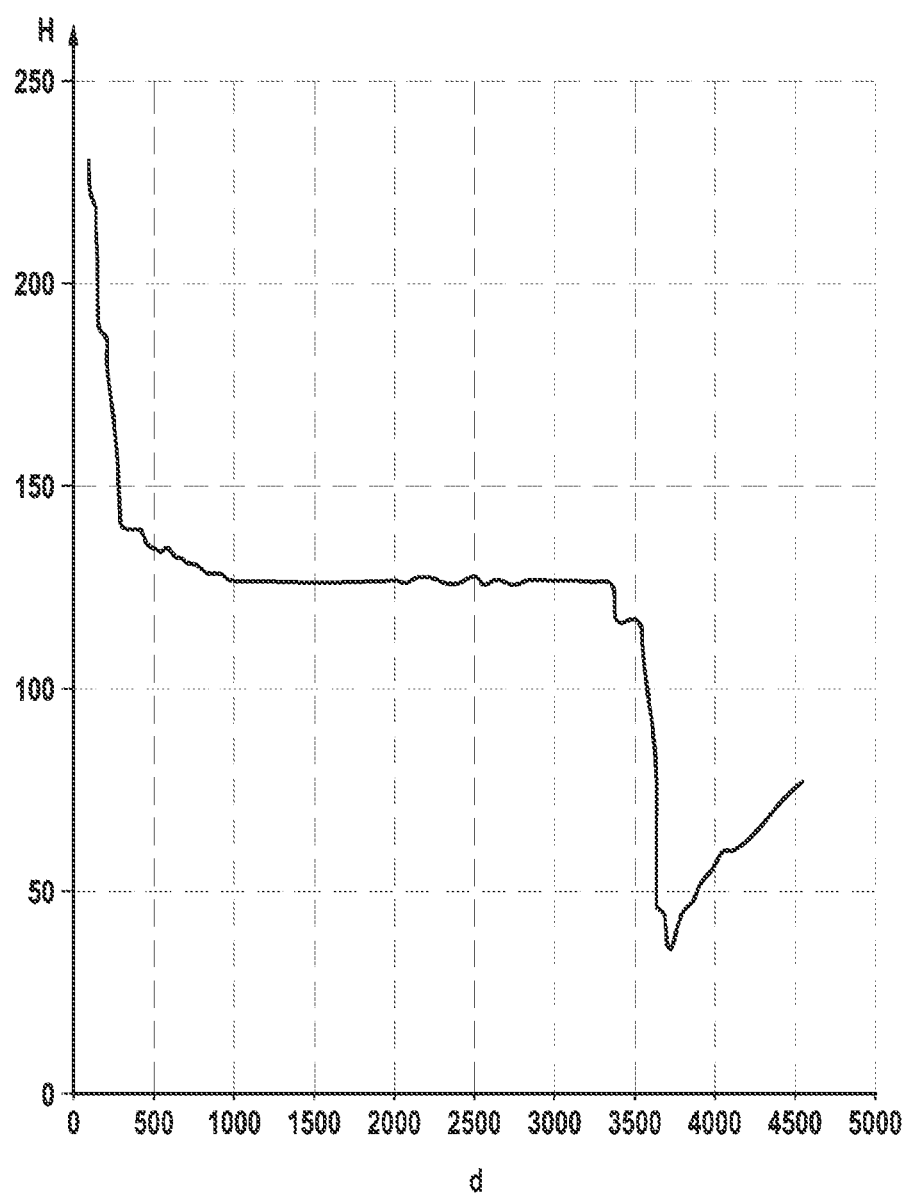
FIGS. 9A and 9B show a comparison between a classification of magnitude undertaken by the control unit, for simulated and real echoes, as a function of the distance, at a speed of 4.5 km/h.
Figure 9B:
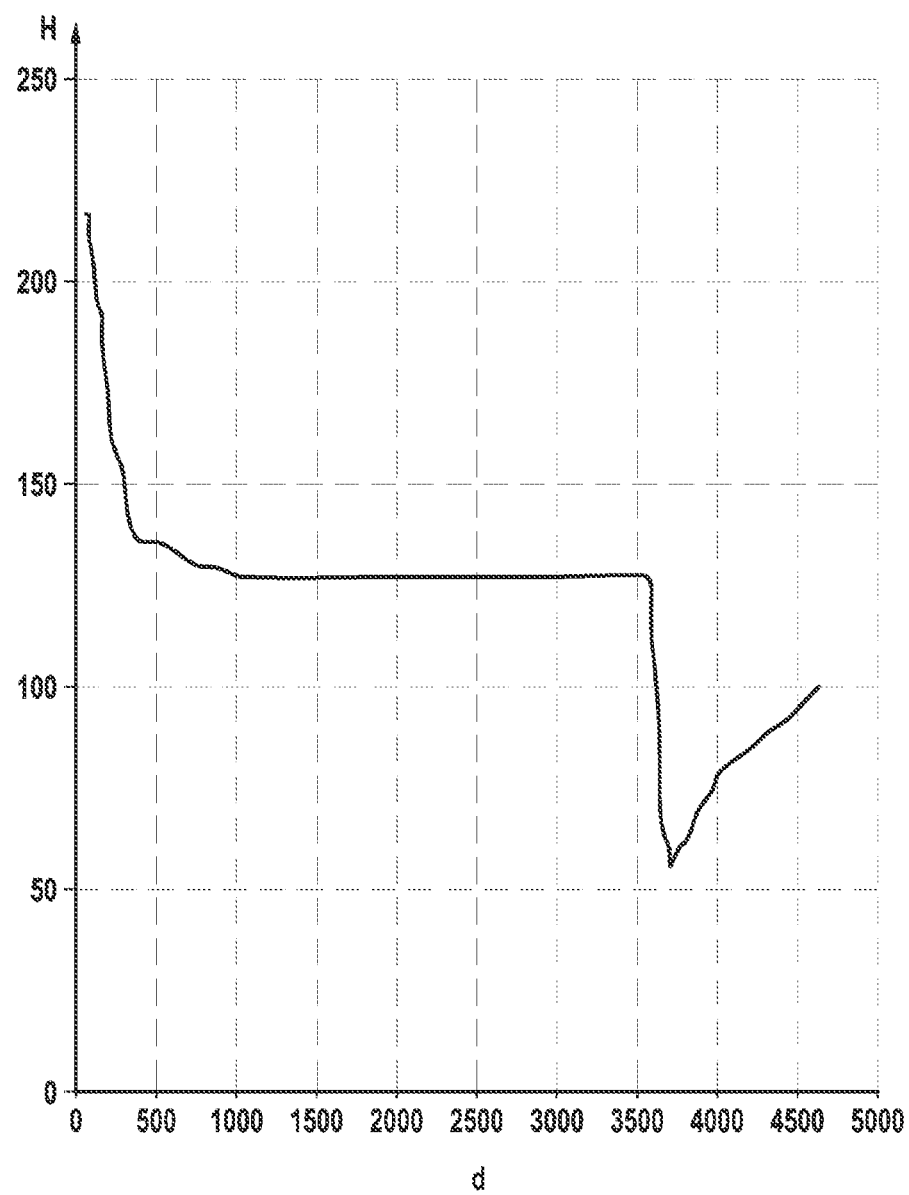

FIGS. 8A and 8B show a comparison between a height classification undertaken by control unit 20 in response to the approach of a pole by simulated vehicle 401, for simulated and real echoes, as a function of the distance, at a speed of 2.5 km/h. FIGS. 9A and 9B show a height classification, as well, but for a speed of 4.5 km/h. FIGS. 8A, 8B, 9A, 9B each show a characteristic of a height parameter H, which indicates the probability of the presence of a high object not able to be traveled over, in arbitrary units, versus the distance d in mm. In each instance, FIGS. 8A and 9A show the characteristic of height parameter H for actual surrounding-area data, and FIGS. 8B and 9B show it for the calculated surrounding-area data. The curves 301, 302, 303, 304, 305, 306 shown in FIGS. 8A, 9A, as well as 8B and 9B, are, respectively, averages of ten actual measurements taken and ten simulations executed, using slightly different parameters.

It may be deduced from FIGS. 8A and 8B, that at a vehicle speed of 2.5 km/h, when the distance falls below approximately 1500 mm, the pole is reliably classified as a high object not capable of being traveled over; the curves 301, 302, 303, 304, 305, 306 for the simulation and the measurement conforming well. Since control unit 20 also accesses the motion data for this classification, this high level of agreement shows the particular advantages of the proposed method.

It may be gathered from FIGS. 9A and 9B, that at a vehicle speed of 4.5 km/h, when the distance first falls below approximately 300 mm, the pole is reliably classified as a high object not capable of being traveled over. Due to the effective characteristics of the proposed method, in particular, with regard to the temporal synchronization of the calculated surrounding-area data and motion data, this unwanted behavior of control unit 20 is reliably detected in the case of both actual measurement and simulation. Consequently, the proposed method is suitable for simulating the function of a control unit 20 of a vehicle reliably.

The present invention is not limited to the exemplary embodiments described here and the aspects emphasized in them. On the contrary, a number of modifications, which lie within the scope of actions undertaken by one skilled in the art, are possible within the scope of the present invention.

What is claimed is:

1. A method for testing a control unit of a vehicle, the control unit obtaining calculated surrounding-area data of at least one simulated surround sensor, using a surround-sensor simulation, and obtaining calculated motion data of a simulated vehicle, using a simulation of the vehicle and of a surrounding area, the simulation of the vehicle and surrounding area being implemented by a computer program, which is executed on a programmable computer device, the calculated motion data being transmitted to the control unit via a simulated vehicle data bus, and using a sensor testing unit, which is connected to the programmable computer device, the calculated surrounding-area data being transmitted to the control unit via a sensor-data transmission circuit different from the vehicle data bus, wherein the following steps are performed for execution of a simulated acquisition of surrounding-area data by the control unit:

a) transmitting by the control unit of a command for executing a measurement, using at least one surround sensor simulated by the surround-sensor simulation, to the sensor testing unit;

b) transmitting by the sensor testing unit data for identifying a position of the at least one simulated surround sensor, to the computer device;

c) calculating by the computer device positions of points of reflection by simulated objects in the surroundings of the vehicle, and transmitting data regarding the calculated positions of the points of reflection to the sensor testing unit;

d) determining by the sensor testing unit calculated surrounding-area data based on the data regarding the calculated positions of the points of reflection; and e) transmitting by the sensor testing unit calculated surrounding-area data regarding the obtained positions of the points of reflection, to the control unit; and wherein the simulation of the vehicle and surrounding area is executed continually by the computer device, and motion data of the simulated vehicle calculated regularly are transmitted to the control unit; the determination of the position of reflection points according to step c) being synchronized temporally with the simulation of the vehicle and surrounding area.

2. The method as recited in claim 1, wherein in step d), the calculated surrounding-area data are determined in view of a visual range of the simulated surround sensor and/or in view of an intended installation location on the simulated vehicle; and i) the calculated surrounding-area data being calculated in advance and stored in a storage device of the sensor testing unit, a grid having a predefined step size being used for positional parameters of the simulated vehicle and the simulated object; or (ii) a calculation of the calculated surrounding-area data being carried out by a processing unit of the sensor testing unit after receipt of the data about the calculated positions.

3. The method as recited in claim 1, wherein in step a), the measurement of a cross echo is requested, and, correspondingly in step b), data regarding a position of a transmitting surround sensor and data regarding a position of a receiving surround sensor are transmitted.

4. The method as recited in claim 1, wherein the at least one simulated surround sensor is an ultrasonic sensor or a lidar sensor or a radar sensor.

5. The method as recited in claim 4, wherein the calculated surrounding-area data include a distance between the simulated surround sensor and a corresponding point of reflection, and at least one attribute describing a quality of a received ultrasonic echo.

6. The method as recited in claim 1, wherein the vehicle data bus is a CAN bus or FlexRay.

7. The method as recited in claim 1, wherein a communication protocol used for communication between the control unit and the sensor testing unit is selected to be identical to a protocol, which is simulated by the sensor testing unit and is used by at least one surround sensor, and the communication is protected cryptographically.

8. The method as recited in claim 1, wherein the control unit is configured to transmit control commands for influencing the longitudinal and/or lateral guidance of the simulated vehicle, via the vehicle data bus, and the simulation of the vehicle and surrounding area is configured to react to the control commands and to influence motion of the simulated vehicle accordingly.

9. A system for testing a control unit of a vehicle, comprising:

a computer device, which is connectible to the control unit via a vehicle data bus; and a sensor testing unit, which is connected to the computer device and is connectible to the control unit via a sensor terminal;

wherein upon connection with a control unit for a vehicle, the system is configured to test a control unit of a vehicle, the control unit obtaining calculated surrounding-area data of at least one simulated surround sensor, using a surround-sensor simulation, and obtaining calculated motion data of a simulated vehicle, using a simulation of the vehicle and of a surrounding area, the simulation of the vehicle and surrounding area being implemented by a computer program, which is executed on the computer device, the calculated motion data being transmitted to the control unit via a simulated vehicle data bus, and using the sensor testing unit, the calculated surrounding-area data being transmitted to the control unit via a sensor-data transmission circuit different from the vehicle data bus, wherein the following steps are performed for execution of a simulated acquisition of surrounding-area data by the control unit:

a) transmitting by the control unit of a command for executing a measurement, using at least one surround sensor simulated by the surround-sensor simulation, to the sensor testing unit;

b) transmitting by the sensor testing unit data for identifying a position of the at least one simulated surround sensor, to the computer device;

c) calculating by the computer device positions of points of reflection by simulated objects in the surroundings of the vehicle, and transmitting data regarding the calculated positions of the points of reflection to the sensor testing unit;

d) determining by the sensor testing unit calculated surrounding-area data based on the data regarding the calculated positions of the points of reflection; and e) transmitting by the sensor testing unit calculated surrounding-area data regarding the obtained positions of the points of reflection, to the control unit; and wherein the simulation of the vehicle and surrounding area is executed continually by the computer device, and motion data of the simulated vehicle calculated regularly are transmitted to the control unit; the determination of the position of reflection points according to step c) being synchronized temporally with the simulation of the vehicle and surrounding area.

\* \* \* \* \*